United States Patent [19]
Mathews et al.

[11] Patent Number: 5,760,716
[45] Date of Patent: Jun. 2, 1998

[54] VECTOR DATA COMPRESSION

[75] Inventors: Brian P. Mathews, De Salle Terrace; Robert D. Covey, Alameda, both of Calif.

[73] Assignee: Autodesk, Inc., San Rafael, Calif.

[21] Appl. No.: 701,042

[22] Filed: Aug. 21, 1996

[51] Int. Cl.$^6$ .................................................. H03M 7/00
[52] U.S. Cl. ......................... 341/50; 341/51; 341/65; 341/106; 341/107
[58] Field of Search ........................ 341/50, 51, 106, 341/107, 65

[56] References Cited

U.S. PATENT DOCUMENTS

| | | |
|---|---|---|
| 4,464,650 | 8/1984 | Eastman et al. . |
| 4,558,302 | 12/1985 | Welch . |
| 4,701,745 | 10/1987 | Waterworth . |
| 4,814,746 | 3/1989 | Miller et al. . |
| 4,906,991 | 3/1990 | Fiala et al. . |
| 4,955,066 | 9/1990 | Norenboom . |
| 4,979,039 | 12/1990 | Kisor et al. . |
| 5,001,478 | 3/1991 | Nagy . |
| 5,003,307 | 3/1991 | Whiting et al. . |
| 5,016,009 | 5/1991 | Whiting et al. . |
| 5,049,881 | 9/1991 | Gibson et al. . |
| 5,051,745 | 9/1991 | Katz . |
| 5,124,791 | 6/1992 | Israelsen et al. . |
| 5,126,739 | 6/1992 | Whiting et al. . |
| 5,140,321 | 8/1992 | Jung . |
| 5,144,679 | 2/1992 | Kakumoto et al. ........................ 382/1 |
| 5,155,484 | 10/1992 | Chambers, IV . |
| 5,229,768 | 7/1993 | Thomas . |
| 5,247,357 | 9/1993 | Israelsen . |
| 5,281,967 | 1/1994 | Jung . |
| 5,300,931 | 4/1994 | Lindsay et al. . |
| 5,371,499 | 12/1994 | Graybill et al. . |
| 5,406,278 | 4/1995 | Graybill et al. . |
| 5,406,279 | 4/1995 | Anderson et al. . |
| 5,450,132 | 2/1995 | Harris et al. ........................... 348/418 |
| 5,524,182 | 6/1996 | Chari et al. ........................... 395/110 |
| 5,577,135 | 11/1996 | Grajski et al. ......................... 382/253 |

OTHER PUBLICATIONS

ZIV, Jacob and LEMPEL, Abraham, *IEEE Transaction Theory*, "A Universal Algorithm for Sequential Data Compression," vol. IT-23, No. 3, May 1977, pp. 337–343.

ZIV, Jacob and LEMPEL, Abraham, *IEEE Transaction on information Theory*, "Compression of Indivdual Sequenes via Variable-rate Coding." vol. IT-24, No. 5, Sept. 1978, PP. 530–536.

*Primary Examiner*—Jeffrey A. Gaffin
*Assistant Examiner*—Jason L. W. Kost
*Attorney, Agent, or Firm*—Merchant, Gould, Smith, Edell, Welter, & Schmidt

[57] ABSTRACT

The present invention discloses a method, apparatus, and article of manufacture for compressing vector data. The vector data is normalized to create normalized vector data. A history buffer is searched for a longest matching vector data that matches the normalized vector data. The longest matching vector data is encoded by assigning a substitution code. The vector data is normalized by translating the vector data to an origin and scaling the vector data to a unit square. The substitution code includes a denormalization function, which converts the normalized vector data to vector data.

25 Claims, 10 Drawing Sheets

VECTOR DATA COMPRESSION

BACKGROUND OF THE INVENTION

1. Field of the Invention

This invention relates in general to data compression techniques, and in particular, to a technique for the compression of vector graphics data.

2. Description of Related Art

Data compression techniques are well-known in the art. Data Compression Techniques such as LZ77 and LZW use substitution algorithms that search for repeated data strings and substitute a coded value for duplicates. These techniques are inefficient for vector graphics data, since such data may define an object once and then reuse the object multiple times, each with a different location offset. Prior art techniques cannot recognize such objects as being duplicates.

For example, a computer aided design (CAD) application may define a "tire" object in its database. However, in rendering a car, the CAD application may reference the tire object four times with a location offset for each reference. This method of referencing the object through a location offset takes much less memory than repeating the entire object.

A problem arises, however, if the CAD application does not have the concept of references and objects. This is particularly commonplace in situations if a CAD application has tessellated its geometry and "reference" and "object" information have been lost. When there is no "reference" or "object" information, drawings are constructed through the use of raw primitives which include lines, polygons, arcs, and circles. If the data stream consists of raw primitives, existing data compression techniques fail to find repeating raw primitives because each of the primitives exists at a different location. For example, the left front, left rear, and right rear tires have nothing in common with the right front tire because the raw primitives which comprise the tires have been translated to their respective locations on the car.

Thus, there is a need in the art for data compression techniques specifically designed for vector graphics data.

SUMMARY OF THE INVENTION

To overcome the limitations in the prior art described above, and to overcome other limitations that will become apparent upon reading and understanding the present specification, the present invention discloses a method, apparatus, and article of manufacture for compressing vector data. The vector data is normalized to create normalized vector data. A history buffer is searched for a longest matching vector data that matches the normalized vector data. The longest matching vector data is encoded by assigning a substitution code. The vector data is normalized by translating the vector data to an origin and scaling the vector data to a unit square. The substitution code includes a denormalization function, which converts the normalized vector data to vector data.

In accordance with further aspects of the invention, in one embodiment the step of searching in the history buffer includes storing in a hash table a hashing function of the history buffer vector data, the hash table having a plurality of entries having a pointer to a location in the history buffer. The vector data in compared to the history buffer data pointed to by the hash table entry.

As will be appreciated from the foregoing brief summary of the invention, the object of the present invention is to provide an efficient method of compressing and decompressing vector data. One advantage of achieving this objective is that vector data that does not have "reference" and "object" information is efficiently compressed.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention comprises a data compression technique that is designed to compress an input stream of primitive data into a shorter output stream. The input data stream is comprised of repeating data strings, wherein each data string is comprised of vector data primitives. The vector data primitives may include a line, polygon, arc, circle, or other raw drawing primitives.

Hardware Environment

Figure 1:
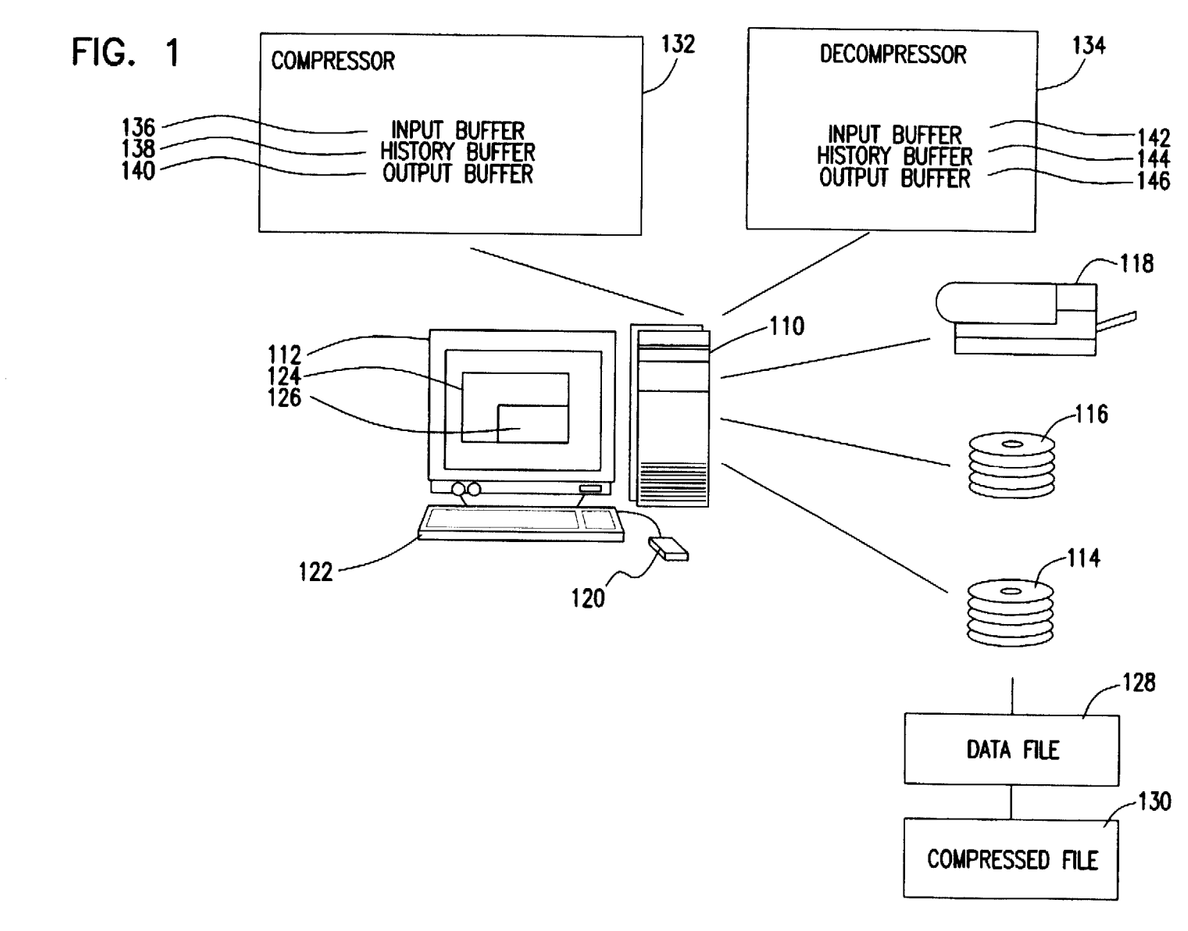
FIG. 1 is a block diagram of an exemplary hardware environment of the preferred embodiment of the present invention.

FIG. 1 is a block diagram that illustrates an exemplary hardware environment of the present invention. The present invention is typically implemented using a personal computer 110 comprised of a microprocessor, random access memory (RAM), read-only memory (ROM), and other components. It is envisioned that attached to the personal computer 110 may be a monitor 112, hard and/or floppy disk drives 114, CD-ROM drives 116, and printer 118 peripherals. Also included in the preferred embodiment may be input devices. for example, a mouse pointing device 120 and a keyboard 122.

The personal computer 110 operates under the control of an operating system 124, such as the Windows, OS/2, Macintosh, or UNIX operating systems, which is represented in FIG. 1 by the screen display on the monitor 112. The personal computer 110 executes one or more computer programs 126, which are represented in FIG. 1 by the "windows" displayed on the monitor 112, under the control of the operating system 124. The present invention comprises an improved data compression function that is preferably implemented in the operating system 124 and/or computer programs 126.

Generally, the operating system 124 and the computer programs 126 are tangibly embodied in a computer-readable medium, e.g., one or more of the fixed and/or removable data storage devices 114 and 116. Both the operating system 124 and the computer programs 126 may be loaded from the data storage devices 114 and 116 into the random access memory of the computer 110 for execution by the microprocessor. Both the operating system 124 and the computer programs 126 comprise instructions which, when read and executed by the microprocessor of the computer 110, causes the computer 110 to perform the steps necessary to execute the steps or elements of the present invention.

In the preferred embodiment, the storage device 114 stores a data file 128 and a compressed data file 130. Further, the memory of computer 110 stores buffers for a compressor program 132 and a decompressor program 134. The compressor program 132 stores data in an input buffer 136, a history buffer 138, and an output buffer 140. The decompressor program 134 stores data in an input buffer 142, a history buffer 144, and an output buffer 146. The compressor program 132 and decompressor program 134 convert the data file 128 to the compressed data file 130 and the compressed data file 130 to the data file 128, respectively.

Those skilled in the art will recognize that the exemplary environment illustrated in FIG. 1 is not intended to limit the present invention. Indeed, those skilled in the art will recognize that other alternative hardware environments may be used without departing from the scope of the present invention.

Vector Data Compression

Figure 2A:
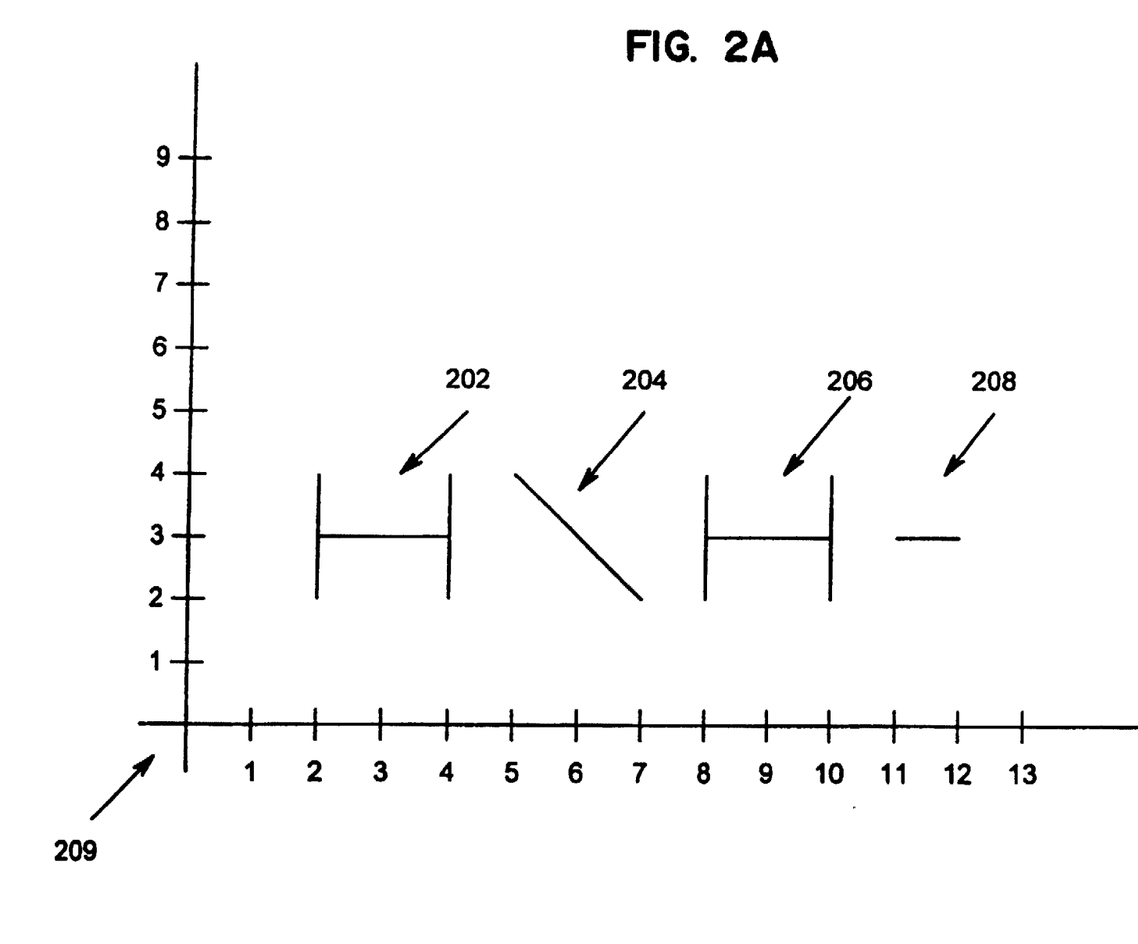
FIG. 2A is a diagram illustrating a vector graphic image.

FIG. 2A is a diagram illustrating an image that could be displayed on the monitor 112 using vector graphics techniques. Objects 202, 204, 206, and 208 are shown in two-dimensional space, represented by the x-y plane 209. Those skilled in the art will recognize that the x-y plane 209 is shown in FIG. 2A for illustration only, and generally is not displayed on the monitor 12 with the objects 202, 204, 206, and 208.

Figure 2B:
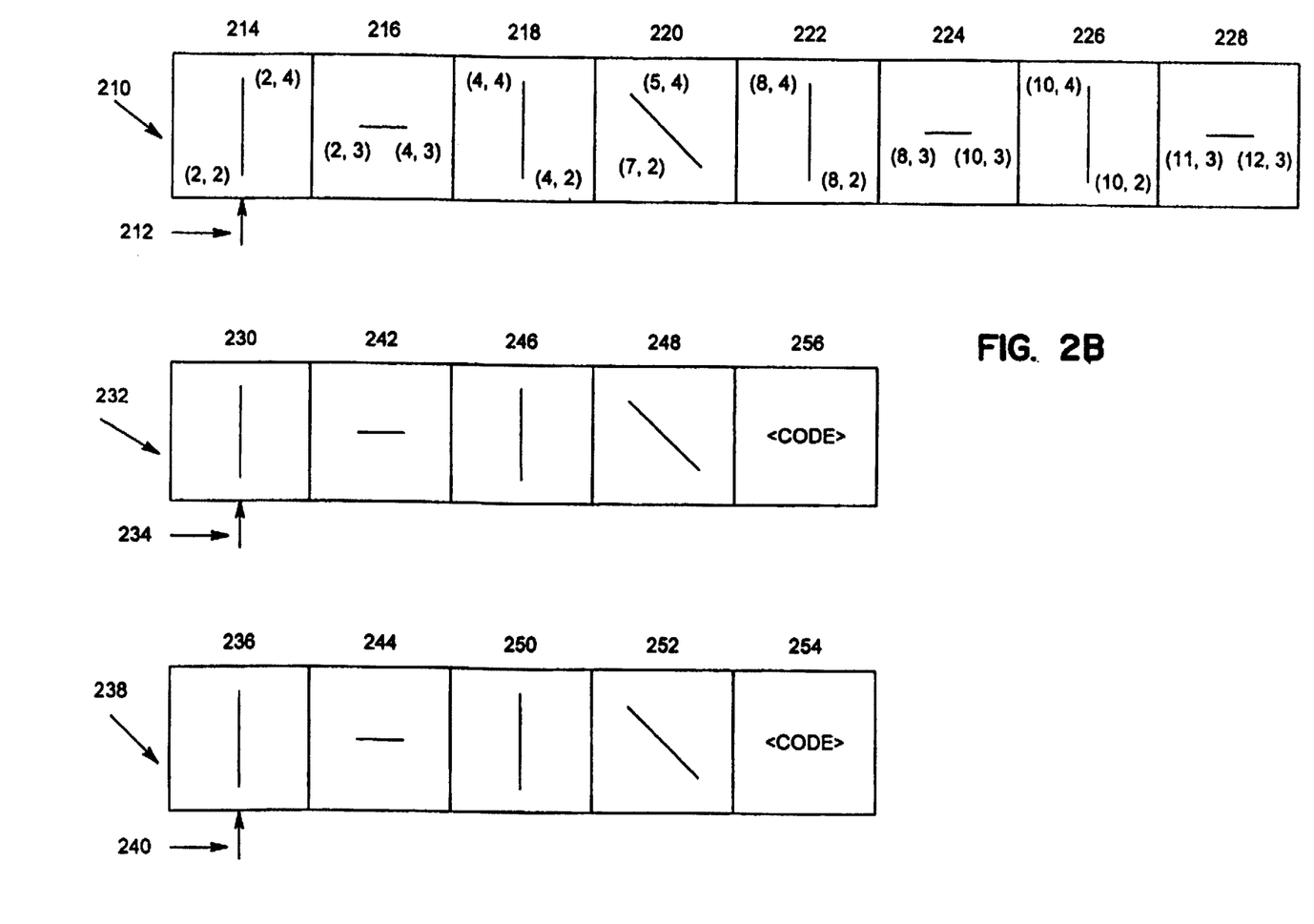
FIG. 2B is a block diagram illustrating data structures used in the preferred embodiment of the present invention.

FIG. 2B is a diagram illustrating the data structures stored in the memory of the computer 110 that represent the objects 202, 204, 206, and 208. The objects 202, 204, 206, and 208 are represented by one or more primitives or coded entries stored in an input buffer 210. The input buffer 210 has an input pointer 212 and a plurality of entries 214–228 for storing the primitives and associated information. In the example of FIG. 2B, the entries for objects 202, 204, 206, and 208 each comprise an identifier indicating that the entry is a line and end coordinates (x1, y1) and (x2, y2) for the line. Objects 202, 204, 206, and 208 could also be comprised of other primitives, such as triangles, circles, arcs, or other objects. For a circle primitive, for example, an entry in the input buffer 210 would comprise an identifier indicating that the entry is a circle, a center coordinate, and a radius value. Other primitives would be similarly encoded in the input buffer 210.

To perform the compression technique of the present invention, the input buffer 210 is scanned from start to end. The first entry 214 in the input buffer 210 is normalized by translating its coordinates to the origin, i.e., to (0,0) in the x-y plane 209, and then the normalized entry is stored in a history buffer 232 in the memory of the computer 110. For example, entry 214 in the input buffer 210 is a line having end coordinates (2, 2) and (2, 4), and thus is translated to entry 230 in the history buffer 232, which is a line having end coordinates (0, 0) and (0, 1) with a scale of (2, 2) and a translation of (2, 2). Entry 214 is also stored unnormalized as entry 236 in an output buffer 238. After these operations, the input pointer 212, history pointer 234, and output pointer 240 are advanced to the next entry.

The second entry 216 in the input buffer 210 is a unique entry not previously represented in the history buffer 232, and thus is similarly normalized by translating its coordinates to the origin, i.e., to (0,0) in the x-y plane 209. The entry represents a line having end coordinates (2, 3) and (4, 3). The normalized entry (a line having end coordinates (0, 0) and (1, 0) with a scale of (2, 1) and a translation of (2, 3)) is then stored in the history buffer 232 as entry 242. Further, entry 216 is also stored unnormalized as entry 244 in the output buffer 238. After these operations, the input pointer 212, history pointer 234, and output pointer 240 are advanced.

Entry 218 in the input buffer 210, however, is a duplicate of entry 214, although with a different origin. Nonetheless, when normalized, entry 218 is identical to entry 230 in the history buffer 232. Entry 218 is a line having end coordinates (4, 2) and (4, 4), but when normalized results in a line having end coordinates (0, 0) and (0, 1) with a scale of (2, 2) and a translation of (4, 2). When entry 218 is normalized and compared to the contents of the history buffer 232, a match occurs (both have end coordinates of (0, 0) and (0, 1)) with entry 230. As a result of the match, the input pointer 212 is advanced.

Entry 220, which is a line having end coordinates (5, 4) and (7, 2), is retrieved from the input buffer 210 and normalized to the first match, resulting in entry 248, which is a normalized line having end coordinates (0, 1) and (1, 0) with a scale of (2, 2) and a translation of (5, 2). The history pointer 234 is advanced and entry 220, which is a line, is normalized and compared to entry 242. Since entries 220 and 242 are not identical, there is no match.

When the length of the matching primitive string is one, the matching string is not encoded. Entry 218 is stored in the output buffer 238 as entry 250 and stored in the history buffer 232 as entry 246, which is a normalized line. The history pointer 234 is reset to the beginning of the history buffer 232. The input pointer 212 is not reset.

The line in entry 220 is normalized and compared to the first entry in the history buffer 232. Since entry 220 and entry 230 do not match, the history pointer 234 is advanced until a match is found or the history pointer 234 reaches the end of the history buffer 232. Since a match for entry 220 is not found in the history buffer 232, the line in entry 220 is stored as a normalized line in entry 248 in the history buffer 232, and stored as entry 252 in the output buffer 238. The history pointer 234 is reset to the beginning of the history buffer 232 and the input pointer 212 is advanced.

Entry 222, which is a line having end coordinates (8, 2) and (8, 4), is normalized (a line having end coordinates (0, 0) and (0, 1) with a scale of (2, 2) and a translation of (8, 2)) and compared to the first entry in the history buffer 232. Since entry 222 and entry 230 are identical, the input pointer 212 and the history pointer 234 are advanced and entry 224, which is a line having end coordinates (8, 3) and (10, 3), is normalized (a line having end coordinates (0, 0) and (1, 0) with a scale of (2, 1) and a translation of (8, 3)) and compared to entry 242, which is a normalized line, stored in history buffer 232. Since there is a match, input pointer 212 and history pointer 234 are again advanced and entry 226, which is a line having end coordinates (10, 2) and (10, 4), is normalized (a line having end coordinates (0, 0) and (0, 1) with a scale of (2, 2) and a translation of (10, 2)) and compared to entry 246 which is a normalized line. Again, there is a match and the history pointer 234 and the input pointer 212 are further advanced.

Entry 228, which is a line having end coordinates (11, 3) and (12, 3), is normalized (a line having end coordinates (0, 0) and (1, 0) with a scale of (1, 1) and a translation of (11, 3)) and compared to entry 248, which is a line, in history buffer 232. Since entries 228 and 248 are not identical, the matching string is encoded and stored as entry 254 in the output buffer 238.

The first value in the encoded string is the opcode. The opcode indicates that the data to follow represents an encoded string. The input string comprised of entries 222, 224 and 226 is encoded by assigning a denormalization function.

The denormalization function is the function that when applied to the matching normalized lines stored in the history buffer 232, will result in the lines retrieved from the input buffer 210. For example, the line in entry 220 was normalized by the function (x/25, y/2−2). Thus, the denormalization function will be (x*2+5, y*2+2).

After the denormalization function is assigned, the position of the first match in the history buffer is recorded. In this example, the first match occurred at the first entry stored in the history buffer 232. The length of the matching string is recorded. The length of the matching string comprised of entries 222, 224 and 226 is three. The encoded value comprising an opcode, the denormalization function, the position, and the length is stored in the output buffer 238 as entry 254. The encoded value in entry 254 is also stored in the history buffer 232 as entry 256 in the history buffer 232.

Storing entries 222, 224, and 226 without encoding requires more memory than encoding. As encoded entries in the history buffer 232 are compared to entries retrieved from the input buffer 210, the encoded entry is decoded so the individual primitives can be compared. After entries 254 and 256 are stored, the history pointer 234 is reset and the data compressor begins compressing the subsequent data found in the input buffer 210.

Compression/Decompression Logic

Figure 3:
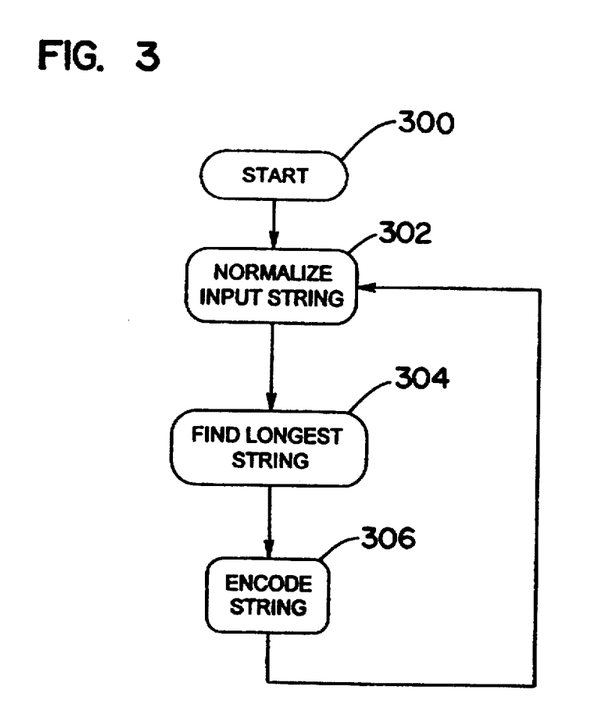
FIG. 3 is a flowchart illustrating the general logic of the data compressor of the present invention.

FIG. 3 is flowchart illustrating the general logic of compressor program 132 as performed by the computer 110. Block 300 represents the start of the logic. Block 302 represents the computer 110 normalizing the input primitive. Block 304 represents the computer 110 searching for the longest matching input string in the history buffer 232. Block 306 represents the computer 110 encoding the longest matching input string. After the longest matching string is encoded, the next input string is normalized and searched for in the history buffer.

Figure 4A:
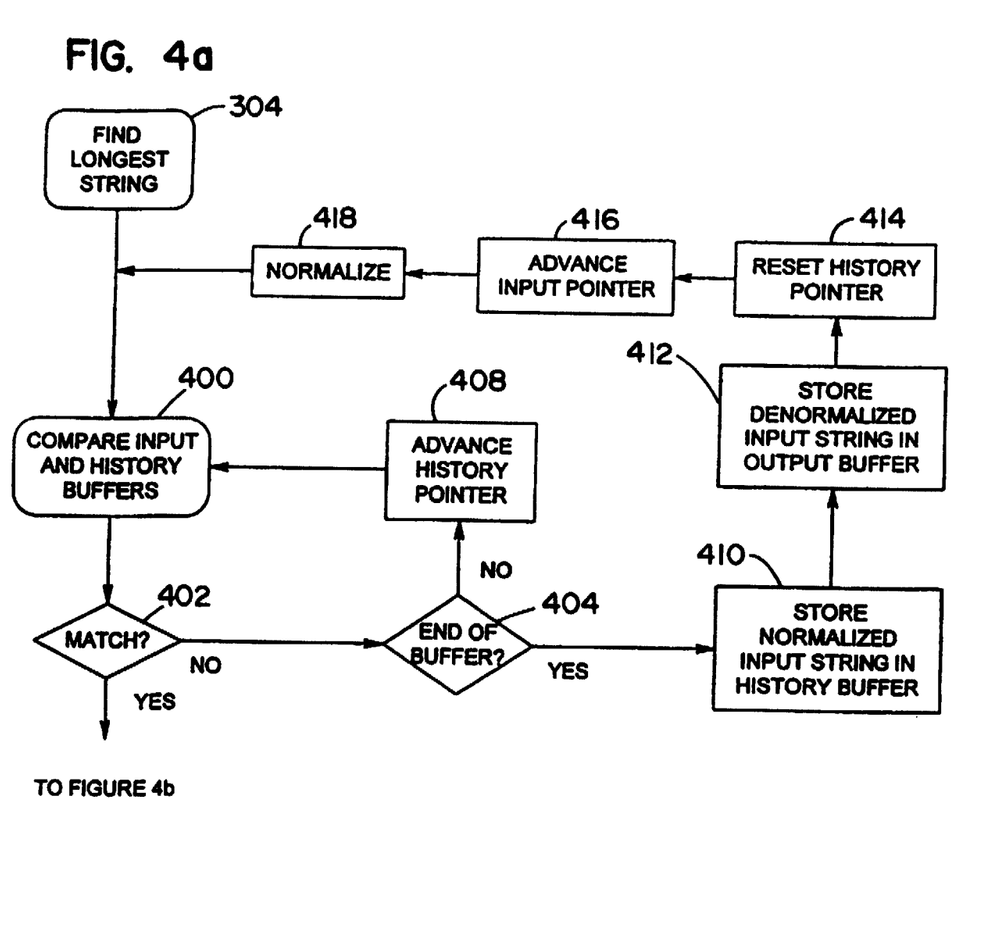
FIGS. 4A and 4B together are a flowchart illustrating the find longest string step of FIG. 3.
Figure 4B:
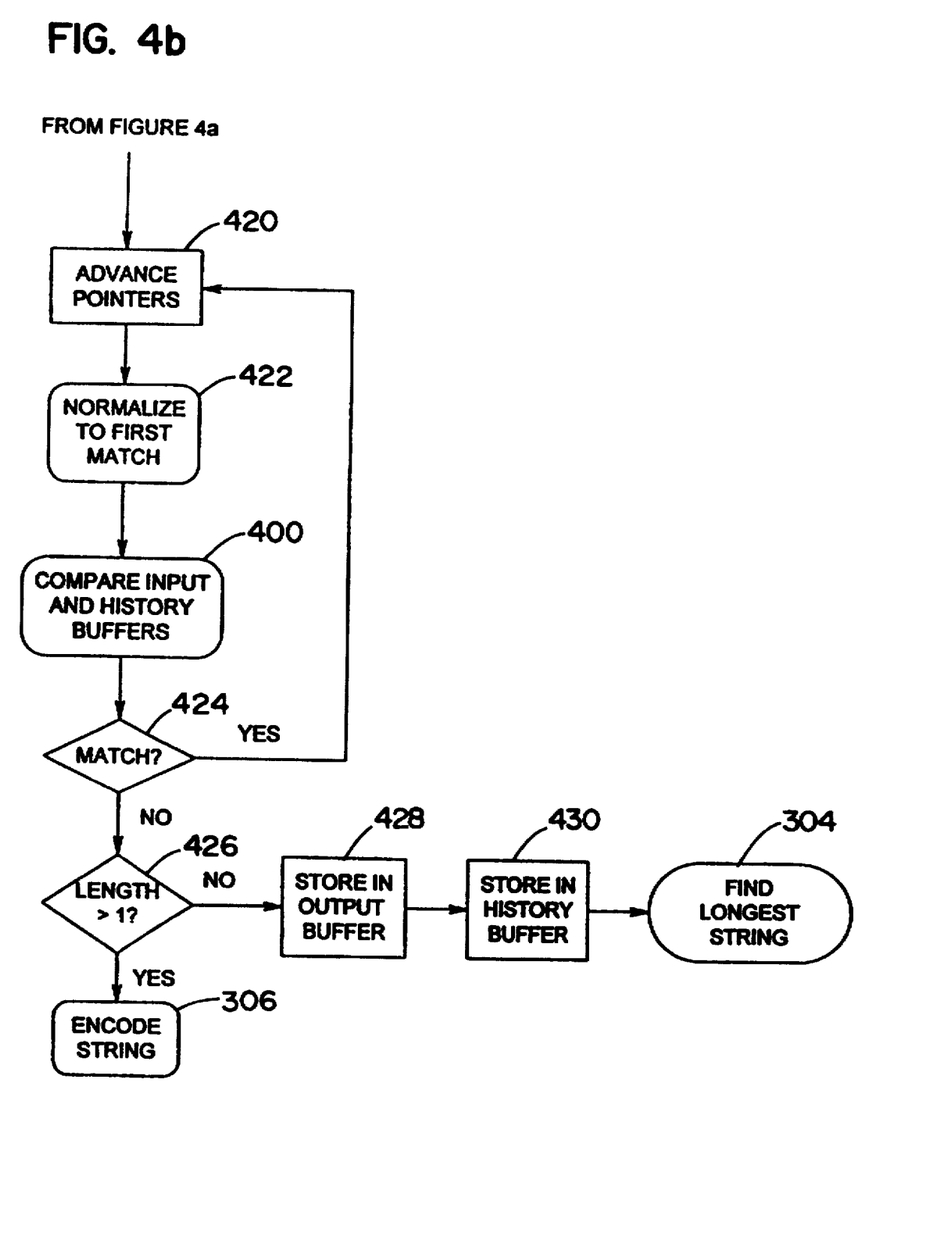

FIGS. 4A and 4B together are a flowchart illustrating the step of finding a longest matching string, as represented by block 304 of FIG. 3. Block 400 represents the computer 110 comparing the normalized input primitive to the primitive indicated by the history pointer 234 in the history buffer 232.

Block 402 is a decision block representing the computer 110 determining whether or not the input primitive matches the primitive indicated by the history pointer 234. If there is no match, block 404 is a decision block representing the computer 110 determining whether the history pointer 234 points to the end of the history buffer 232. If the history pointer 234 does not point to the end of the history buffer 232, block 408 represents the computer 110 advancing the history pointer 234 and block 400 represents the computer 110 comparing the input primitive and the next history primitive. This process continues until the end of the history buffer 232 is reached or a match is found.

Decision block 404 represents the computer 110 determining whether the end of the history buffer 232 has been reached, and if so, then block 410 represents the computer 110 appending the normalized input primitive to the end of the history buffer 232. Block 412 represents the computer 110 storing the denormalized input primitive in the output buffer 238.

Next, block 414 represents the computer 110 resetting the history pointer 234 to the start of the history buffer 232 and block 416 represents the computer 110 advancing the input pointer 212 in input buffer 210 to the next primitive and block 418 represents the computer 110 normalizing the next entry. Block 420 represents the computer 110 comparing the input primitive and the primitive indicated by the history pointer 234, and if a match is found, block 420 represents the computer 110 advancing both the history pointer 234 and the input pointer 212. Block 422 represents the computer 110 normalizing the input primitive by the same function as the first match, not normalizing the input primitive to the origin.

For example, if the first input primitive that matched a primitive in the history buffer 232 was a line having end coordinates (2, 2) and (2, 4), it is normalized to a line having end coordinates (0, 0) and (0, 1) with a scale of (2, 2) and a translation of (2, 2). Thus, the normalization function is represented by (x/2−2, y/2−2). If the next input primitive had end coordinates (3, 5) and (3, 7), it would be normalized by the same function as the first matching primitive and thus the normalized line would have end coordinates (0, 0) and (0, 1) with a scale of (2, 2) and a translation of (3, 5). Block 400 represents the computer 110 comparing this line having end coordinates (0, 0) and (0, 1) to the next primitive in the history buffer 232.

Block 424 is a decision block that represents the computer 110 determining if there is a match between the input primitive normalized to the first match and the next primitive in the history buffer 232. If there is a match, block 420 represents the computer 110 advancing the input pointer 212 and the history pointer 234 and the next primitive in the input buffer 210 is normalized to the first match. Thus, the normalization function would again be (x/2−2, y/2−2) in this example.

If no match is found, block 426 represents the computer 110 determining if the first match found resulted in a string with a length greater than one, for example. If only one primitive is matched, the primitive is stored as an unencoded primitive because the encoded value of that primitive would require more memory to store than simply storing the primitive. For example, a line having end coordinates (3, 6) and (7, 9) is stored in the output buffer 238 as a line having end coordinates (3, 6) and (7, 9). Thus, if the length of the matching primitive string is 1, block 428 represents the computer 110 storing the primitive denormalized in the output buffer 238 and block 430 represents the computer 110 storing the primitive normalized in the history buffer 232. The history pointer 234 is reset and block 304 is repeated to find the longest string.

Figure 5:
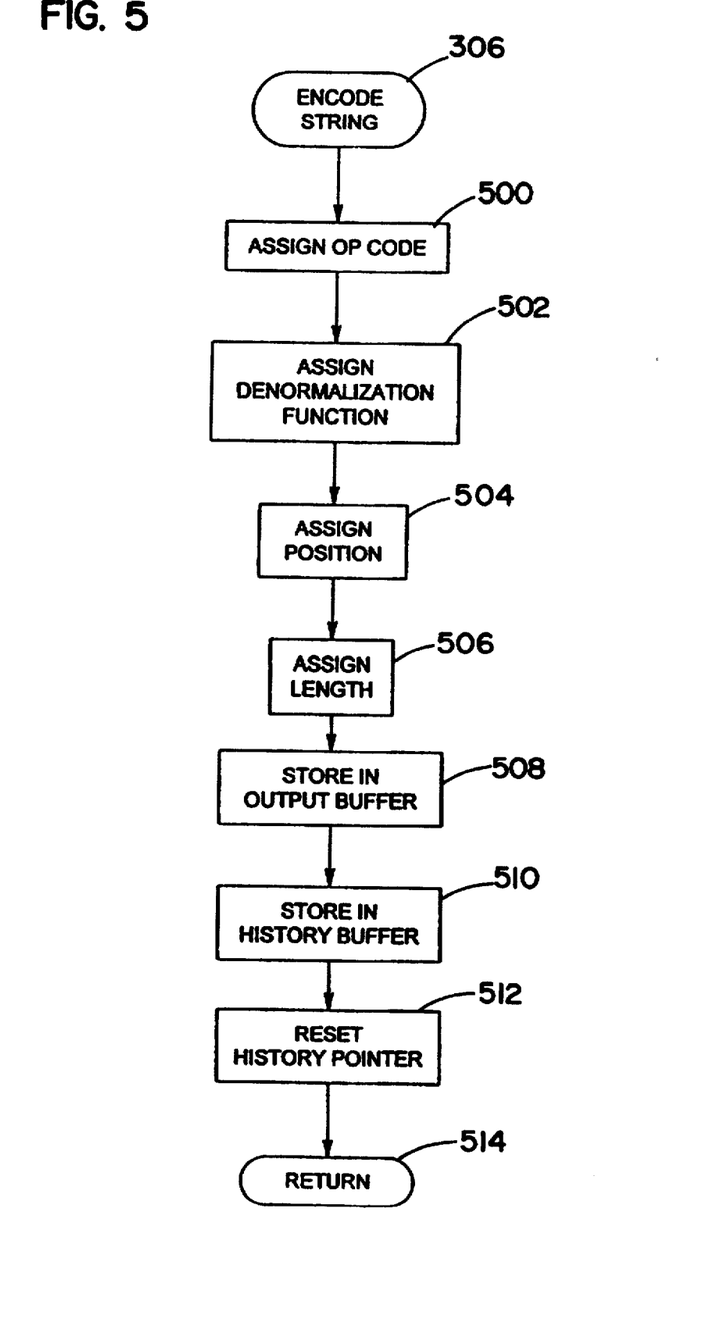
FIG. 5 is a flowchart illustrating the encode function of the present invention.

FIG. 5 is a flowchart illustrating the encode function of the present invention, as represented by block 306 in FIG. 3. The encoded primitive is represented by an opcode represented by block 500. The opcode indicates that the information to follow represents an encoded primitive instead of an unencoded primitive.

Block 502 represents the computer 110 performing the denormalization function. The denormalization function is the function required to translate the normalized primitive in the history buffer 234 to the original primitive from the input buffer 210. For example, a line having end coordinates (2, 2) and (2, 4) is normalized by subtracting 2 from the x coordinates and 2 from the y coordinates resulting in a line having end coordinates (0, 0) and (0, 2). To make a unit square, the values are also divided by 2 to arrive at (0, 0) and (0, 1). The denormalization function to return this line to its original coordinates is represented by (x*2+2, y*2+2).

After the denormalization function is stored, block 504 represents the computer 110 encoding the position that the first matching primitive was found in the history buffer. This could be an offset from the beginning of an array.

Block 506 represents the computer 110 storing the length of the matching primitive. For example, if the matching primitive was found starting at the fourth position of the history buffer 232 and the next 3 primitives matched, the position would be represented by 4 and the length of the match would be 3.

Block 508 represents the computer 110 storing the encoded string, represented by the opcode, the denormalization function, the starting position within the history buffer, and the length in the output buffer. Block 510 represents the computer 110 also storing the encoded string in the history buffer. Block 512 represents the computer 110 resetting the history pointer 234. Block 514 represents the end of the logic and control returns to the main program in FIG. 3.

Figure 6:
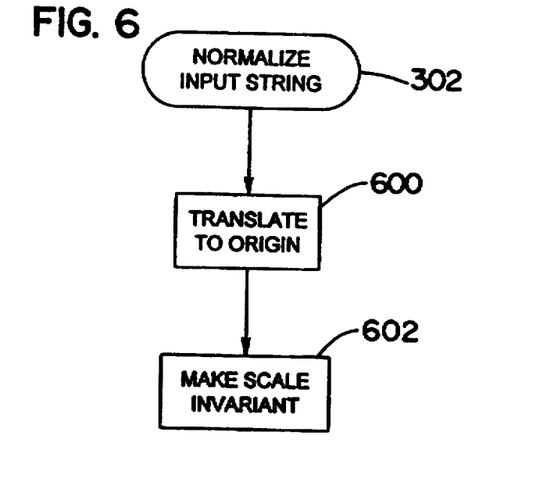
FIG. 6 is a flowchart illustrating the normalization step of the present invention.

FIG. 6 is a flowchart illustrating the normalization step of the present invention, as represented by block 302 in FIG. 3. Block 606 represents the computer 110 translating the input primitive to the origin.

For example, a circle primitive with a center at coordinates (2, 4) and a radius of 5 would be translated by a function of (x−2, y−4) to a circle at (0, 0) with a radius of 5. Block 602 represents the computer 110 making the input primitive scale invariant. For example, the circle at (0, 0) with a translation function (x−2, y−4) and a radius of 5 would be scaled to a circle at (0, 0) with a radius of 1 and a scale factor of 5. Thus, a circle found at a first location may be encoded by referencing a larger circle found at a second location.

In an alternative embodiment of this invention, the computer 110 uses a hash table to speed up the search for matching primitives in the history buffer. The hash table stores a hashing function of the contents of the history buffer and a pointer to a location in the history buffer. A hashing function is run on the input primitive and the corresponding history pointer is retrieved from the hash table. A hash table may also be used to speed the search in the history buffer by storing a plurality of pointers for a certain hashing function. For example, all line primitives may yield a hash function of 32 and all triangle primitives may yield a hash function of 42. If a hash function on the input primitive yields a 32, then the hash table could store the entries in the history buffer where line primitives are stored. The input line primitive and the line primitive stored in the hash table could then be compared to determine if there is a match.

Figure 7:
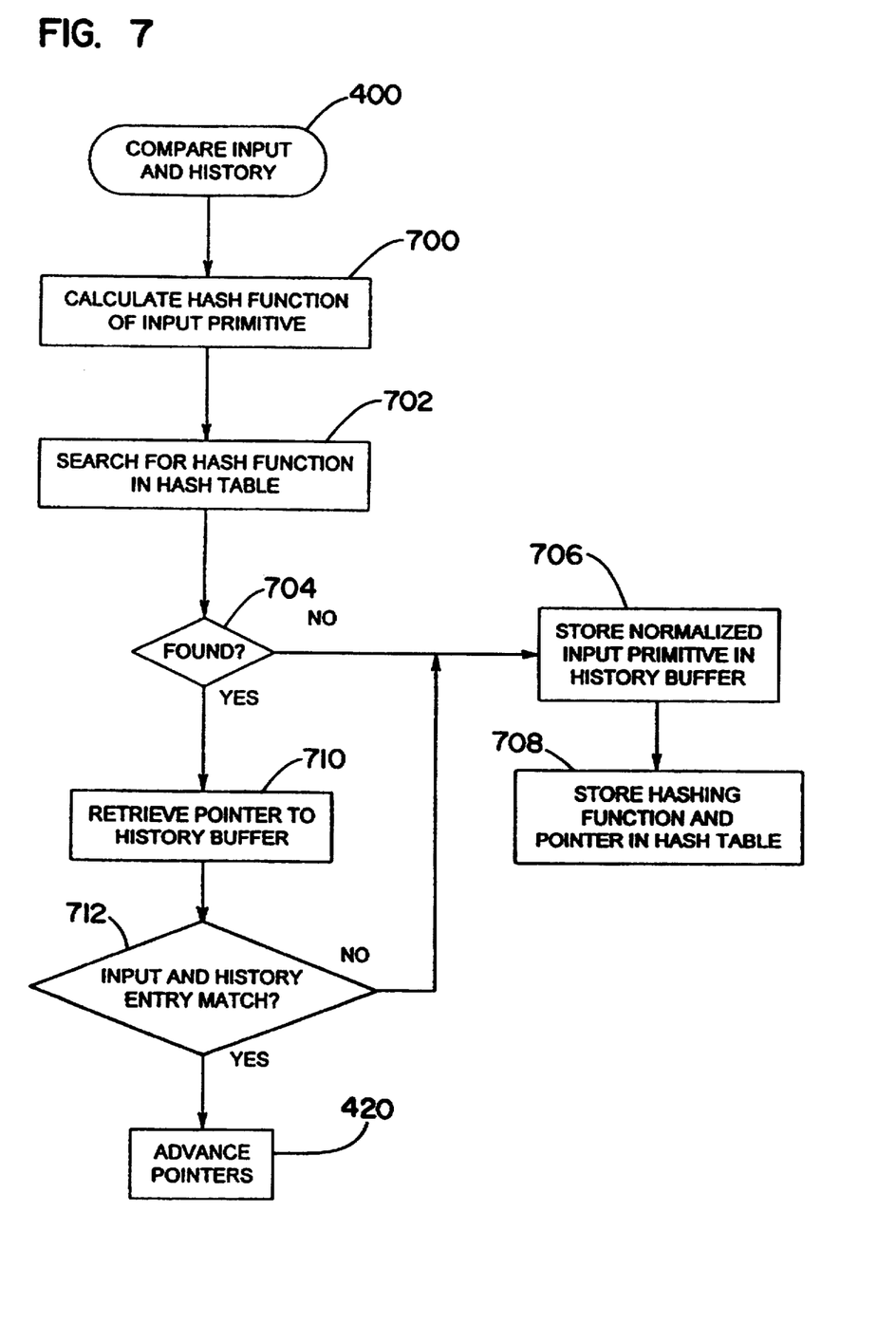
FIG. 7 is a flowchart illustrating the logic of a hashing function used in the present invention.

FIG. 7 is a flowchart illustrating a hashing function used in the present invention. The hashing function is an alternative embodiment of the compare input string and history string step, as represented by block 400 in FIG. 4. Block 700 represents the computer 110 calculating a hashing function of the input primitive. Block 702 represents the computer 110 searching in a hash table for the hashing function. Block 704 is a decision block that represents the computer 110 determining whether or not the function was found in the hash table. If the function is not found, block 706 represents the computer 110 storing the normalized input string in the history buffer.

Block 708 represents the computer 110 storing in the hash table the hashing function and pointer to the location of the normalized input string in the history buffer. If the hash function is found in the hash table, block 710 represents the computer 110 retrieving the pointer or pointers to the history buffer.

Block 712 is a decision block that represents the computer 110 comparing the input primitive and the contents of the history buffer. If they do not match, block 706 represents the computer 110 storing the normalized input string in the history buffer.

Block 708 represents the computer 110 storing in the hash table the hashing function and pointer to the location of the normalized input string in the history buffer. If the input primitive and the primitive stored in the history buffer match, then block 420 represents the computer 110 advancing the history pointer and the input pointer.

Figure 8:
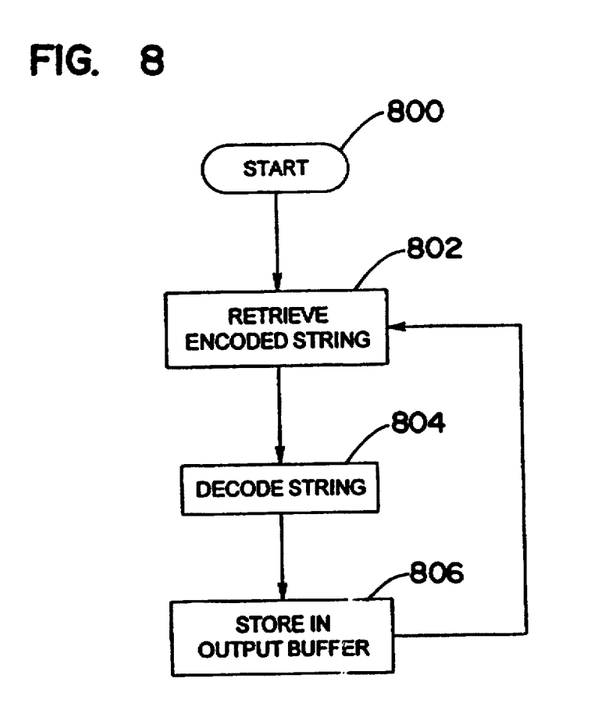
FIG. 8 is a flowchart illustrating the general logic of the data decompressor of the present invention.

FIG. 8 is a flowchart illustrating the general logic of the decompressor program 134 of the present invention. Block 800 represents the start of the logic. Block 802 represents the computer 110 retrieving the encoded string from the encoded data input buffer. Block 804 represents the computer 110 decoding the encoded data. Block 806 represents the computer 110 storing the decoded data in an output buffer.

The data is decoded by retrieving the encoded value from the compressed data stream which comprises an opcode, the denormalization function, the position, and the length. The opcode indicates to the computer 110 that the values to follow represent encoded data. The computer 110 retrieves the data referenced by the position and length from the history buffer. This data is denormalized by the denormalization function and stored in the output buffer as decompressed data.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of compressing vector data using a history buffer, comprising the steps of:
normalizing the vector data, wherein the vector data is comprised of one or more primitives representing one or more graphics objects and one or more coordinate values indicating locations for each of the graphics object, and the normalizing step comprises the steps of translating the locations of the graphics objects to an origin and scaling the coordinate values of the graphic objects;

searching the history buffer for a longest matching vector data that matches the normalized vector data; and when the searching step finds the longest matching vector data, encoding the longest matching vector data found in the history buffer by assigning a substitution code.

2. The method of claim 1, wherein the step of searching in the history buffer further comprises the steps of:

storing a hashing function of the history buffer vector data in a hash table, the hash table having a plurality of entries, the entries having a pointer to a location in the history buffer; and searching in the hash table entries by comparing the hash table entries to a hashing function of the vector data.

3. The method of claim 2, further comprising the step of comparing the vector data to the history buffer vector data pointed to by the hash table entry.

4. The method of claim 1, wherein the substitution code further comprises a denormalization function.

5. The method of claim 1, wherein the substitution code further comprises an operation code, a length of the matching vector data, and a pointer indicating the position within the history buffer of the matching vector data.

6. The method of claim 1, wherein the step of encoding further comprises the step of storing the substitution code in the history buffer.

7. The method of claim 1, wherein the normalizing step further comprises the step of scaling the vector data to a unit square.

8. The method of claim 1, wherein the history buffer has a plurality of entries for storing vector data and coded vector data.

9. An apparatus for compressing vector data, comprising:

a computer having a memory, a monitor, and a data storage device;

means, performed by the computer, for normalizing the vector data, wherein the vector data is comprised of one or more primitives representing one or more graphics object and one or more coordinate values indicating locations for each of the graphics object, and the means for normalizing comprises means for translating the locations of the graphics objects to an origin and for scaling the coordinate values of the graphic objects;

means, performed by the computer, for searching in a history buffer for a longest matching vector data that matches the normalized vector data; and means, performed by the computer, for encoding the longest matching vector data found in the history buffer, when the means for searching finds the longest matching vector data, by assigning a substitution code.

10. The apparatus of claim 9, wherein the means for searching in the history buffer further comprises:

means for storing a hashing function of the history buffer vector data in a hash table, the hash table having a plurality of entries, the entries having a pointer to a location in the history buffer; and means for searching in the hash table entries by comparing the hash table entries to a hashing function of the vector data.

11. The apparatus of claim 10, further comprising means for comparing the vector data to the history buffer vector data pointed to by the hash table entry.

12. The apparatus of claim 9, wherein the substitution code further comprises a denormalization function.

13. The apparatus of claim 9, wherein the substitution code further comprises an operation code, a length of the matching vector data, and a pointer indicating the position within the history buffer of the matching vector data.

14. The apparatus of claim 9, wherein the encoding means further comprises means for storing the substitute code in the history buffer.

15. The apparatus of claim 9, wherein the normalizing means further comprises means for scaling the vector data to a unit square.

16. The apparatus of claim 9, wherein the history buffer has a plurality of entries for storing vector data and coded vector data.

17. A program storage device, readable by a computer having a memory and coupled to a data storage device, tangibly embodying one or more programs of instructions executable by the computer to perform method steps for compressing vector data stored in the data storage device, the method comprising the steps of:

normalizing the vector data, wherein the vector data is comprised of one or more primitives representing one or more graphics object and one or more coordinate values indicating locations for each of the graphics object, and the normalizing step comprises the steps of translating the locations of the graphics objects to an origin and scaling the coordinate values of the graphic objects;

searching a history buffer for a longest matching vector data that matches the normalized vector data; and when the searching step finds the longest matching vector data, encoding the longest matching vector data found in the history buffer by assigning a substitution code.

18. The program storage device of claim 17, wherein the step of searching in the history buffer further comprises the steps of:

storing a hashing function of the history buffer vector data in a hash table, the hash table having a plurality of entries, the entries having a pointer to a location in the history buffer; and searching in the hash table entries by comparing the hash table entries to a hashing function of the vector data.

19. The program storage device of claim 18, further comprising the step of comparing the vector data to the history buffer vector data pointed to by the hash table entry.

20. The program storage device of claim 17, wherein the substitution code further comprises a denormalization function.

21. The program storage device of claim 17, wherein the substitution code further comprises an operation code, a length of the matching vector data, and a pointer indicating the position within the history buffer of the matching vector data.

22. The program storage device of claim 17, wherein the substitution code further comprises an operation code, a length of the matching vector data, and a pointer indicating the position within the history buffer of the matching vector data.

23. The program storage device of claim 17, wherein the step of encoding further comprises the step of storing the substitute code in the history buffer.

24. The program storage device of claim 17, wherein the normalizing step further comprises the step of scaling the vector data to a unit square.

25. The program storage device of claim 17, wherein the history buffer has a plurality of entries for storing vector data and coded vector data.

* * * * *

UNITED STATES PATENT AND TRADEMARK OFFICE
CERTIFICATE OF CORRECTION

PATENT NO. : 5,760,716

DATED : June 2, 1998

INVENTOR(S) : Brian P. Mathews and Robert D. Covey

It is certified that error appears in the above-identified patent and that said Letters Patent is hereby corrected as shown below:

Title page, item [75], "De Salle Terrace" should read --Fremont--.

Title page, item[56], U.S. PATENT DOCUMENTS, after "9/1990", "Norenboom" should read --Notenboom--.

Title page, item [56], OTHER PUBLICATIONS, after "of", "Indivdual Sequenes" should read --Individual Sequences--.

Signed and Sealed this

Twentieth Day of July, 1999

Attest:

Q. TODD DICKINSON

*Attesting Officer*   *Acting Commissioner of Patents and Trademarks*